United States Patent
Chouquet et al.

(10) Patent No.: US 9,040,141 B2
(45) Date of Patent: May 26, 2015

(54) METHOD FOR TEXTURING DLC COATINGS, AND TEXTURED DLC COATINGS THUS OBTAINED

(75) Inventors: Caroline Chouquet, Gestel (FR); Cédric Ducros, Bevenais (FR); Jérôme Gavillet, Sant Egreve (FR); Frédéric Sanchette, Montferrat (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 214 days.

(21) Appl. No.: 13/378,877

(22) PCT Filed: Jun. 9, 2010

(86) PCT No.: PCT/FR2010/051144
§ 371 (c)(1),
(2), (4) Date: Mar. 14, 2012

(87) PCT Pub. No.: WO2011/007064
PCT Pub. Date: Jan. 20, 2011

(65) Prior Publication Data
US 2012/0183731 A1    Jul. 19, 2012

(30) Foreign Application Priority Data
Jul. 17, 2009  (FR) ..................... 09 54965

(51) Int. Cl.
*D06N 7/04*   (2006.01)
*G11B 5/64*   (2006.01)
(Continued)

(52) U.S. Cl.
CPC .......... *C30B 33/12* (2013.01); *Y10T 428/24355* (2015.01); *B05D 1/265* (2013.01); *B05D 2350/33* (2013.01); *B05D 1/202* (2013.01); *B05D 1/32* (2013.01); *B05D 3/142* (2013.01); *B05D 2401/32* (2013.01); *C23C 16/26* (2013.01); *C23C 16/56* (2013.01)

(58) Field of Classification Search
None
See application file for complete search history.

(56) References Cited

U.S. PATENT DOCUMENTS 5,560,839 A * 10/1996 Bennett et al. ................ 216/100
6,524,874 B1    2/2003 Alwan
(Continued)

FOREIGN PATENT DOCUMENTS

EP        1947220 A1      7/2008
FR        2 918 981   *   1/2009 ............. C03C 17/22
WO  WO-2008001670 A1      1/2008

OTHER PUBLICATIONS

Gavrilova et al., Etching polystyrene prior to meallising with soln. containing ethanol, thiourea, and di:methyl formamide; abs.; 1981.*
(Continued)

*Primary Examiner* — Duy Deo
(74) *Attorney, Agent, or Firm* — Harris Beach PLLC

(57) ABSTRACT

This method for texturing a DLC coating comprises depositing a single layer of balls or spheres on the free surface of the DLC coating; dry-etching the DLC coating using oxygen plasma; and lastly, cleaning the surface of said coating by eliminating the balls or spheres.

6 Claims, 2 Drawing Sheets

(51) Int. Cl.
*C30B 33/12* (2006.01)
*B05D 1/26* (2006.01)
*C23C 16/26* (2006.01)
*C23C 16/56* (2006.01)
*B05D 1/20* (2006.01)
*B05D 1/32* (2006.01)
*B05D 3/14* (2006.01)

(56) References Cited

U.S. PATENT DOCUMENTS

2006/0228897 A1* 10/2006 Timans ............... 438/758
2006/0246218 A1   11/2006 Bienkiewicz et al.
2009/0246310 A1* 10/2009 Sakurai et al. ........ 425/470

OTHER PUBLICATIONS

European Patent Office, International Search Report; International Application No. PCT/FR2010/051144, dated Sep. 23, 2010 (3 pgs).

Yasumaru et al; "Control of tribological properties of diamond-like carbon films with femtosecond-laser-induced nanostructuring"; Applied Surface Science, vol. 254 (2008) pp. 2364-2368.

Pettersson et al; "Friction and wear properties of micro textured DLC coated surfaces in boundary lubricated sliding", Tribology Letters, vol. 17, No. 3, Oct. 2004, pp. 553-559.

Marciano, et al.; "Use of near atmospheric pressure and low pressure techniques to modification DLC film surface", Surface & Coatings Technology, vol. 204 (2009), pp. 64-68.

J. Robertson; "Diamond-like amorphous carbon", Materials Science and Engineering R 37 (2002), pp. 129-281.

* cited by examiner

US 9,040,141 B2

METHOD FOR TEXTURING DLC COATINGS, AND TEXTURED DLC COATINGS THUS OBTAINED

CROSS REFERENCE TO RELATED APPLICATIONS

This application is a National Stage filing under 35 U.S.C. §371 of PCT Application No. PCT/FR2010/051144, filed on Jun. 9, 2010. This application also claims the benefit of French Application No. 0954965, filed Jul. 17, 2009. The entirety of both applications is incorporated herein by reference.

BACKGROUND OF THE INVENTION

This invention relates firstly to a specific method for modifying and in particular texturing a Diamond-like Carbon (DLC) surface coating.

Such coatings or films are well known today and typically are formed of a film of hydrogenated amorphous carbon, which has properties of high hardness, low coefficient of friction, adhesion, electrical insulation and chemical inertness that are of particular use in respect of tribological applications.

The term "DLC" is mainly taken to mean a so-called hydrogenated amorphous carbon denoted a-C:H; in the knowledge that DLC is well defined in the specialist literature (J. Robertson, Materials Science and Engineering R(27), 2002, 129-281.)

Notwithstanding the low coefficient of friction qualities of the DLC coatings known hitherto, research is being conducted into optimising said qualities for particular applications.

Such is the purpose of this invention.

SUMMARY OF THE INVENTION

The invention relates to a method for texturing DLC coatings which comprises: depositing a single layer of balls or spheres on the free or upper surface of the DLC coating, dry-etching the DLC coating using oxygen plasma, and lastly, cleaning the surface of said coating by removing the balls or spheres.

Put another way, the invention comprises texturing a DLC coating using a simple method, limited to the implementation of three steps, dispensing with conventional etching techniques such as lithography.

In so doing, the method according to the invention serves to limit such potential damage to the DLC coating as may be generated by etching methods using laser ablation for example, with the attendant deterioration in the properties of said coating.

The invention is particularly well suited to treating the DLC coated surfaces of machine engine parts that have contours, in other words are non plane, particularly those with a 3D geometry.

According to the invention, DLC is taken to mean a hydrogenated amorphous carbon material denoted a-C:H According to the invention, the single layer of balls or spheres may be deposited using the so-called Langmuir-Blodgett technique. This technique, now fully mastered, is used to transfer a single layer of nano- or micro-particles from a liquid bath to the surface of a substrate.

In so doing, it is possible, with this technique, to deposit balls or spheres of different natures, and in particular those made of silica or polymers, such as in particular latex or polystyrene, said balls or spheres being able to have a diameter of between 100 nanometers and more than 10 micrometers.

This technique is known in order to allow a uniform single layer of balls or spheres to be obtained, with a high organisation rate.

Alternatively, the single layer of balls or spheres may be deposited using the technology known as "dip-coating". This technology will be preferred when it is required to texture large surfaces or three-dimensional geometries.

Additionally, the liquid bath may contain apart from the solvent for dispersing the balls or spheres, a surfactant, for example triton X-100®.

According to the invention, the DLC coating is dry-etched using selective chemistry, and in particular using oxygen plasma, allowing a preferential attack on the DLC coating instead and in place of the material constituting the balls or spheres, in particular silica.

Alternatively, the balls may consist of polymer such as Latex or polystyrene.

According to the invention, the surface of the DLC coating may be cleaned, after etching, in an ethanol bath so that said balls or spheres may be removed. Removal is taken to mean the discharging of the balls from the surface.

Given the treatment used, the texturing implemented on the surface of the DLC coating is characterised by the presence of apertures or cavities of variable dimensions, the size of said cavities being conditioned by the size of the balls used. The cavities may possibly be in communication with each other.

According to the invention, said aperture factor, in other words the number of apertures per unit of surface area, may be increased by implementing an intermediate step of $SF_6$+ $CHF_3$ plasma etching, prior to the etching using oxygen plasma.

The invention also relates to machine wear or friction parts that have a surface coating of the DLC type, textured according to the inventive method.

The coating of these machine parts may thus have an aperture factor, i.e. the number of apertures or cavities per unit of surface area of said coating, greater than 10%.

Additionally, at least some of the apertures or cavities present on the surface of the DLC type coating are in communication, so as to promote the circulation of a lubricant.

BRIEF DESCRIPTION OF THE FIGURES

The manner in which invention may be embodied and the resulting advantages will become clearer from the following embodiment example, given by way of example and non-restrictively, supported by the appended figures among which.

DETAILED DESCRIPTION OF THE INVENTION

Figure 1:
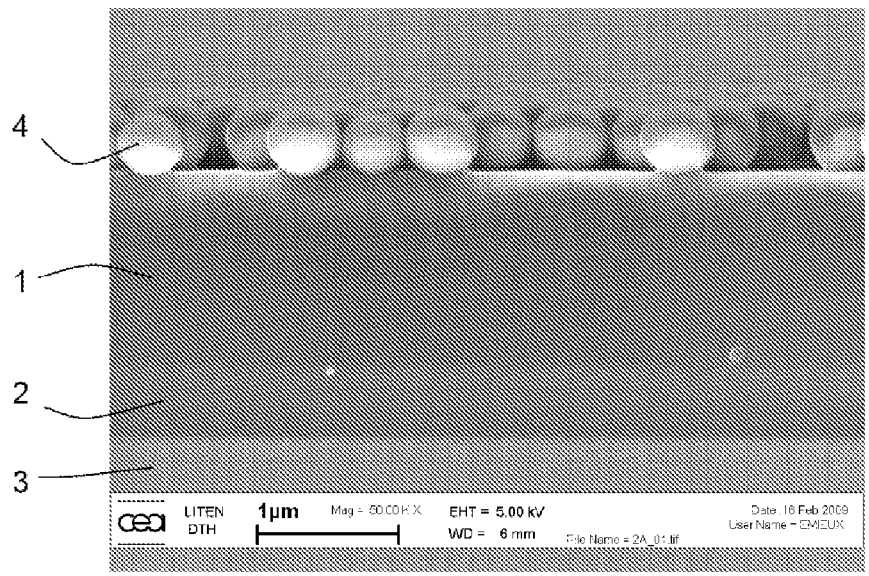
FIG. 1 is a diagrammatic view seen from the side of a substrate coated with a DLC coating and of the single layer of balls or spheres in accordance with the inventive method.
Figure 2:
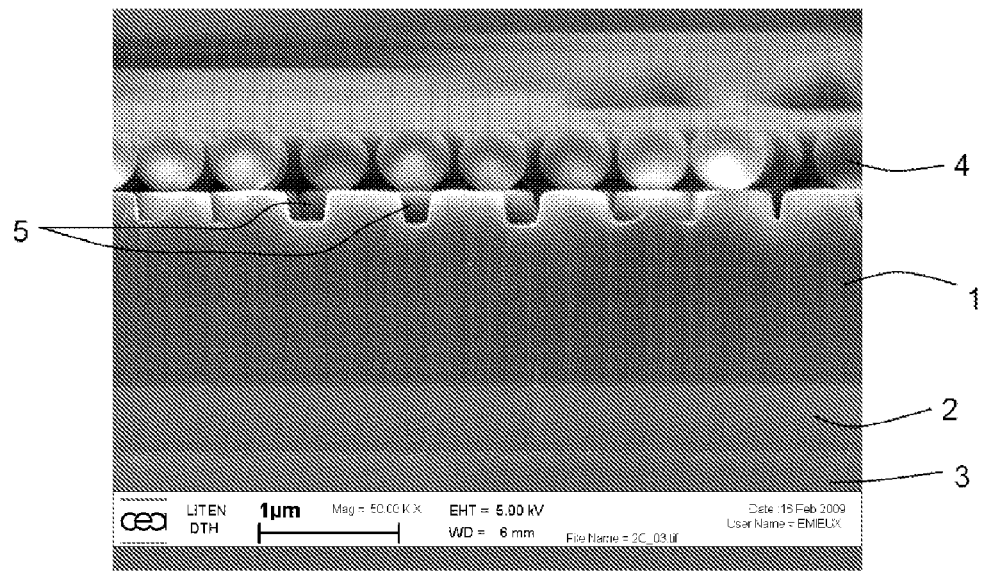
FIG. 2 is a view similar to FIG. 1, obtained consecutively to the etching step.

According to the invention, the first step in the method therefore comprises depositing a single layer (4) of balls or spheres on the surface of a DLC coating (1). The latter is conventionally deposited on a substrate (3), pre-coated with a layer of primer (2) which may for example be made of hydrogenated silicon carbide.

To this end, a piece of equipment from the company NANOMETRIX may be used that is suited to the Langmuir-Blodgett technique.

Use is made to this end of balls made of silica, that have a diameter of one micrometer with dispersion of about 10%, said balls being put into solution in a solvent that is to advantage constituted by butanol.

Alternatively, a mixture of water and ethanol may be used. The required condition is for there to be sufficient wettability of the DLC by the solvent containing the balls.

The solution used has a ball concentration of about 37.5 g/l. This concentration must generally be between 30 and 50 g/l.

Once the balls have been deposited, evaporating the solvent in air serves to congeal the self-organised structure of the balls on the surface of the coating.

The second step in the inventive method is then implemented which is the plasma etching of the DLC coating layer. This etching is conducted using the "Reactive Ion Etching" or RIE technique with the following parameters:

Nature of gas: Oxygen
Flow rate: 80 sccm
Power: 10 W
Pressure: 3 Pa
Voltage: 320 V.

Conducting said etching under these conditions gives a DLC layer etching rate of approximately 0.53 nm/s.

Using said oxygen plasma means that a very great selectivity is obtained, typically in a ratio of 22 to 1 between the DLC coating and the silica constituting the balls. In so doing, said DLC coating is attacked very preferentially by the plasma instead and in place of the balls, the latter acting as a kind of mask. In this way cavities (5) are created that extend from the upper surface (6) of the DLC coating.

The next step is then the cleaning of the surface of the DLC coating after etching. This cleaning comprises removing the single layer of balls. Said removal is typically obtained by soaking the assembly after etching in an ethanol bath for fifteen minutes and subjecting it to ultrasonics. Alternatively to the ultrasonics, any soft mechanical technique may be used (friction, scavenging, etc.,), for the purpose of releasing the balls from the coating.

Figure 3:
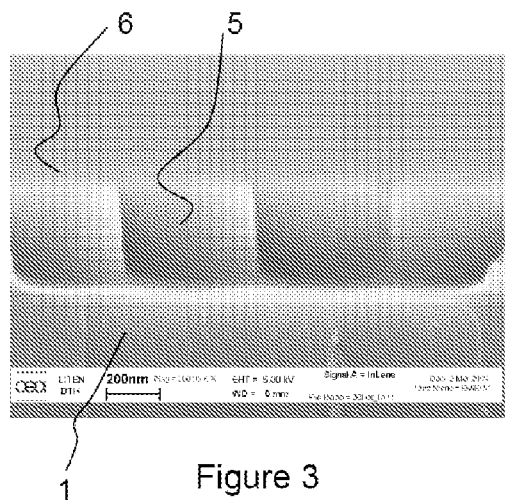
FIG. 3 is a view of the surface of the coating after cleaning, in other words after taking away the layer of balls or spheres, whereof
Figure 4:
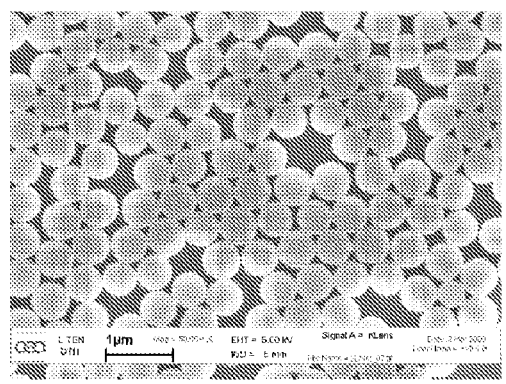
FIG. 4 is a view from above.

A coating is thus obtained of the type shown in FIGS. 3 and 4. In particular etching patterns (5) may be observed that have variable dimensions, the size of said patterns or cavities being conditioned by the size of the balls used.

It may be noted that if a compact stack is considered, i.e. with the greatest possible self-organisation of the balls or spheres on the surface of the coating, the volume V of a cavity is given by the following relation:

$$V = (\sqrt{3} - \frac{\pi}{2})r^2 d$$

an expression wherein r denotes the radius of a ball and d is the depth of the cavity.

It may be observed that whatever the size of the balls used, a compact stack produces an aperture factor of 10%, the size of the balls then conditioning only the size of the cavities or apertures.

However, said factor may be increased by implementing an intermediate etching step, using $SF_6+CHF_3$ plasma, which then serves to reduce the size of the balls.

Said intermediate step serves this time to selectively etch the silica balls as opposed to the DLC type coating. The average diameter of the balls is then reduced but the self-organisation endures, and since it is not in the nature of $SF_6+CHF_3$ plasma to modify the organisation of the balls between themselves, the latter remain positioned at the same place as at the end of the single layer deposition step.

Thus, by reducing the diameter of the balls from 500 nm to 400 nm, the aperture factor of the pattern is increased from 10 to 42%.

In so doing, prior to the dry-etching of the DLC coating, a controlled etching of the balls or spheres may be implemented, by selective chemistry, and in particular using $SF_6+CHF_3$ plasma.

It then becomes possible to adjust the dimensions of the patterns or cavities on the surface of the DLC coating as a function of the geometry and size of the contact being explored, thereby modulating the tribological properties of the coating.

In particular, said additional etching step allows cavities to be created that are in full communication, uniform and non-directional, so that a fluid of interest, for example a lubricant, can be caused to flow, when a machine part provided with said coating is used. Said lubricant is then no longer confined to the discrete cavities, ensuring better distribution of the lubricant over the entire part, and in particular at points where mechanical stress such as friction is being sustained.

Tests conducted show that the texturing of the DLC coating has no preferred direction, so that the patterns obtained do not condition the direction of the friction, unlike the texturing methods obtained using prior art techniques which generate uniform and directional patterns.

Tribology tests have been conducted on the coatings obtained in accordance with the invention by means of a tribometer of the "ball-on-disk" type supplied by the CSM Company using a 100Cr6 steel ball.

Figure 5:
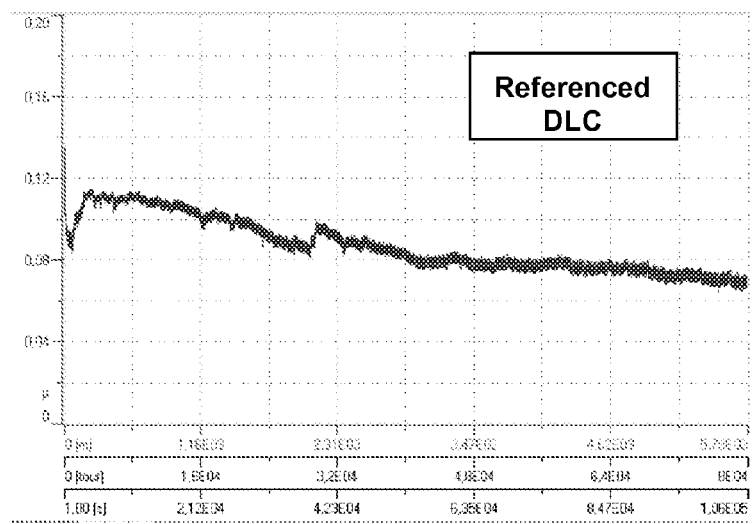
FIGS. 5 and 6 are graphs showing the variation in the coefficient of friction as a function of the distance covered by a steel ball within a tribometric device of the "ball-on-disk" type, for a non-textured DLC coating and for a coating textured in accordance with the invention respectively.
Figure 6:
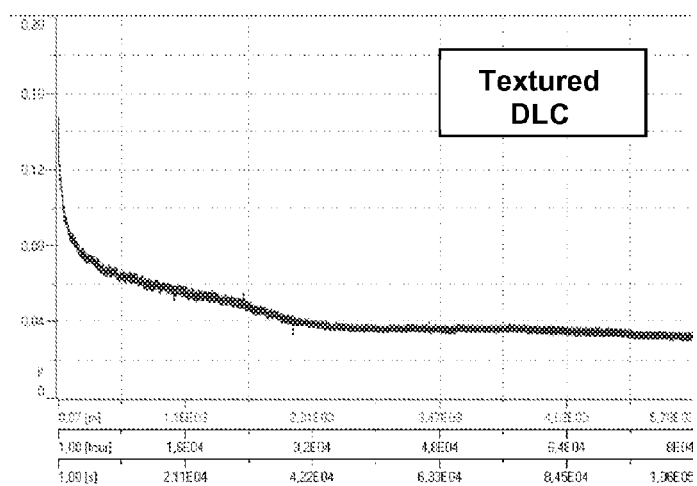

Results are obtained as specified in FIGS. 5 and 6 with the following parameters:

Hertz pressure: 1.1 GPa
Rotation speed: 5.5 cm/s
distance covered: 5780 m
engine lubricant: 8 mL (standard oil)

Changes in the coefficient of friction as a function of the distance covered by the ball may thus be observed, on the graphs in FIGS. 5 and 6, for a non-textured DLC coating (FIG. 5), and for a DLC coating textured in accordance with the invention (FIG. 6) from a masking implemented with silica balls 1 μm in diameter and with a depth of etching of the DLC coating of about 300 nm respectively.

It may thus be noted that the coefficient of friction is about 0.07 for a non-textured DLC coating, whereas it is in the region of 0.035 for the textured DLC, highlighting thereby the optimisation of the tribological properties.

The invention also relates to the use of the method previously defined for the production of machine parts subject to wear or frictioning. In particular, this easy-to-use method is immediately accessible for parts of complex geometry.

The invention claimed is:

1. A machine wear or friction part having a DLC surface coating textured by a method comprising:

depositing a single layer of balls or spheres on the free surface of the DLC coating, controlled etching of the balls or spheres, by selective chemistry, dry-etching the DLC coating using oxygen plasma,
and lastly, cleaning said coating by removing the balls or spheres;
said DLC coating having cavities subsequent to texturing, whereof the volume V is given by the following relation:

$$V = \left(\sqrt{3} - \frac{\pi}{2}\right)r^2 d$$

an expression wherein:
r denotes the radius of a ball or sphere, and d is the depth of the cavity;
adding a lubricant within said cavities;
wherein a controlled etching of the balls or spheres is carried out using a $SF_6+CHF_3$ plasma; and
wherein the diameter of the balls or spheres is between 100 nanometers and 10 micrometers.

2. The machine wear or friction part having a textured DLC surface coating of claim 1, wherein the single layer of balls or spheres is deposited using the Langmuir-Blodgett technique.

3. The machine wear or friction part having a textured DLC surface coating of claim 1, wherein the single layer of balls or spheres is deposited using dip-coating technology.

4. The machine wear or friction part having a textured DLC surface coating of claim 1, wherein the surface of the DLC coating is cleaned, after etching, by soaking in an ethanol bath to remove said balls or spheres.

5. The machine wear or friction part having a textured DLC surface coating of claim 4 wherein the ethanol bath is additionally subjected to ultrasonics.

6. The machine wear or friction part having a textured DLC surface coating of claim 1, wherein the balls or spheres are made of silica or polymers such as in particular Latex or polystyrene.

* * * * *